United States Patent [19]

Gustavsson

[11] Patent Number: 5,396,365
[45] Date of Patent: Mar. 7, 1995

[54] POLARIZATION-INDEPENDENT OPTICAL DEVICE AND METHOD FOR POLARIZATION-INDEPENDENT PROCESSING OF A SIGNAL

[75] Inventor: Mats Gustavsson, Stockholm, Sweden

[73] Assignee: Telefonaktiebolaget L M Ericsson, Stockholm, Sweden

[21] Appl. No.: 11,291

[22] Filed: Jan. 29, 1993

[30] Foreign Application Priority Data

Jan. 30, 1992 [SE] Sweden .................. 9200267

[51] Int. Cl.$^6$ .............................................. G02B 6/10
[52] U.S. Cl. ..................................... 359/337; 359/195
[58] Field of Search ............... 359/195, 192, 344, 337, 359/333

[56] References Cited

U.S. PATENT DOCUMENTS

| | | |
|---|---|---|
| 4,932,737 | 6/1990 | Yoon et al. . |
| 4,941,738 | 7/1990 | Olsson .................. 359/195 |
| 4,952,017 | 8/1990 | Henry et al. ............... 359/195 |
| 5,077,822 | 12/1991 | Cremer . |
| 5,090,790 | 2/1992 | Zucker .................. 359/483 X |
| 5,151,818 | 9/1992 | Thijs et al. .............. 359/344 |
| 5,185,828 | 2/1993 | van der Tol .............. 359/195 X |
| 5,198,921 | 3/1993 | Aoshima et al. ........... 359/344 X |

OTHER PUBLICATIONS

S. Cole et al., "Polarisation-Insensitive, Near-Travelling-Wave Semiconductor Laser Amplifiers at 1.5 μm", *Electronics Lett.* vol. 25, pp. 1387–1388 (1989).

C. Cremer et al., "Bragg Gratings on InGaAsP/InP Wave Guides As Polarisation Independent Optical Filters", *J. Lightwave Technol.* vol. 7, pp. 1641–1645 (Nov. 1989).

A. Ellis et al., "A Novel All Electrical Scheme for Laser Amplifier Gain Control", *Proc. of the 14th European Conf. on Optical Communication* Brighton, United Kingdom, pp. 487–490 (Sep. 1988).

L. Eskildsen et al., "Automatic Gain and Power Control of Semiconductor Laser Amplifiers", *Proc. 16th European Conference on Optical Communication*, pp. 621–624 (1990).

G. Glastre et al., "Polarisation Insensitive 1.55 μm Semiconductor Integrated Optical Amplifier With Access Waveguides Grown by LP-MOCVD", *Electronics Lett.* vol. 27, pp. 899–900 (May 23, 1991).

G. Grosskopf et al., "Optical Amplifier Configurations With Low Polarisation Sensitivity", *Electronics Lett.* vol. 23, pp. 1387–1388 (1987).

M. Janson et al., "Monolithically Integrated 2×2 InGaAsP/InP Laser Amplifier Gate Switch Arrays", *Proc. of the 17th European Conf. on Optical Communication* Paris, France (Sep. 9–12, 1991).

M. Koga et al., "Polarisation Insensitive Optical Amplifier Consisting of Two Semiconductor Laser Amplifiers and a Polarisation Insensitive Isolator in Series", *IEEE Photonics Technol. Lett.* vol. 1, pp. 431–433 (Dec. 1989).

(List continued on next page.)

*Primary Examiner*—Mark Hellner
*Attorney, Agent, or Firm*—Burns, Doane, Swecker & Mathis

[57] ABSTRACT

The present invention relates to an optical device comprising a wave-guide and a polarization converter, the wave-guide and the polarization converter comprising one common unit, the length of the wave-guide being so chosen in relation to the rotation of the polarization-state of an input signal that the device is independent of the polarization as well as a method for polarization-independent processing of an optical signal. The polarization of the signal is rotated when it goes through a wave-guide, the rotation taking place in the wave-guide itself and the length of the wave-guide being so chosen that the processing of the signal is independent of the polarization-state upon incidence.

35 Claims, 6 Drawing Sheets

OTHER PUBLICATIONS

K. Magari et al., "Polarization Insensitive Traveling Wave Type Amplifier Using Strained Multiple Quantum Well Structure", *IEEE Photonics Technol. Lett.* vol. 2, pp. 556–558 (Aug. 1990).

B. Mersali et al., "1.55 μm High-Gain Polarisation-Insensitive Semiconductor Travelling Wave Amplifier with Low Driving Current", *Electronics Lett.* vol. 26, pp. 124–125 (1990).

N. Olsson, "Polarisation-Independent Configuration Optical Amplifier", *Electronics Lett.* vol. 24, pp. 1075–1076 (1988).

N. Olsson et al., "Polarisation-Independent Optical Amplifier with Buried Facets", *Electronics Lett.* vol. 25, pp. 1048–1049 (1989).

Y. Shani et al., "Polarization Rotation in Asymmetric Periodic Loaded Rib Waveguides", *Appl. Phys. Lett.* vol. 59, pp. 1278–1280 (Sep. 9, 1991).

M. Sumida, "Polarisation Insensitive Configuration of Semiconductor Laser Amplifier", *Electronics Lett.* vol. 25, pp. 1913–1914 (1990).

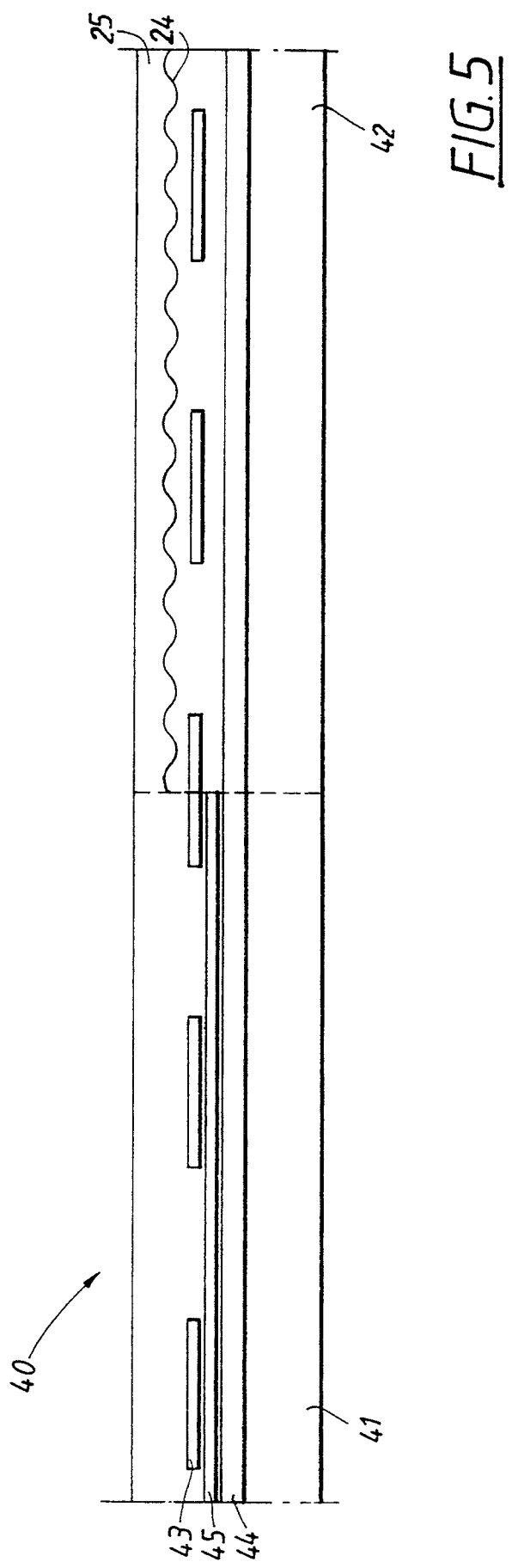

POLARIZATION-INDEPENDENT OPTICAL DEVICE AND METHOD FOR POLARIZATION-INDEPENDENT PROCESSING OF A SIGNAL

BACKGROUND

The present invention relates to polarization-independent optical devices and to a method for polarization independent processing of a signal. Different optical devices, as for example optical amplifiers and optical filters or combined optical, amplifying filters are used for example in optical communication systems, e.g. in integrated components for optical-signal-processing. An important problem with these devices resides in that they generally are polarization-dependent. This means particularly that the device has different influence on the parts of an input signal which are TE-polarized and TM-polarized respectively. This means e.g. for an optical amplifier or a laser amplifier that the gain will be different for TE-polarized and TM-polarized waves respectively; the difference in gain between the differently polarized waves can under certain circumstances be of several decibels which gives rise to significant problems. The problem resides thus in that for incident signals with different polarization states, the modes experience an optical device, for example an amplifier or a reflection filter or a combination of both, in different ways. A consequence thereof is, besides impaired amplification qualities or reflection properties in general, problems in the form of impaired properties upon use together with conventional monomode-fibres or other components which do not preserve the polarization state of the signal. Generally it can be said that the polarization-dependence of optical bulk laser amplifiers is explained by the active wave guide having an asymmetric cross-sectional geometry or the active layers being asymmetric. This asymmetry gives rise to differences in optical confinement factors, effective refractive indices and facet-reflectivities for the transversal electrical and magnetical modes respectively of the waveguide, in this context those modes of the wave guide are meant for which the predominating part of the electrical and magnetical field strength vector respectively is parallel with the horizontal plane and perpendicular to the direction of propagation. These differences are particularly pronounced when common laser-diode-structures are used as amplifiers since those often have an active layer, the thickness of which is considerably smaller than the width of the same. The polarization-sensitivity makes the optical amplifiers incompatible with systems using conventional monomode fibres which do not preserve the state of polarization. So called distributed Bragg-filters are polarization-dependent mainly due to the difference in propagation constants, i.e. effective indices for the TE-, TM-modes.

A large number of solutions to the above mentioned problem have been suggested. According to one solution, as given in M. Sumida: "Polarisation insensitive configuration of semiconductor laser amplifier", Electron. Lett., vol. 26, p. 1913–1914, 1990 a combined so called splitter/combiner is used which splits up incident light in s-, and p-polarized beams, each beam going through a so called Faraday-rotator with a rotation angle of 45° whereafter they go through a polarisation maintaining fibre whereupon they are injected into a laser-amplifier. In this they are amplified with the same TE-mode gain, propagating through the rotation maintaining fibres and finally they go through the Faraday-rotators. Finally, the s-, and p-polarised beams respectively are combined in the combiner. In this device the amplifier itself is polarisation-dependent but the device taken as a whole, behaves, seen from the outside as a polarisation-independent device. Another suggestion of a solution to the problem is given in "Polarisation-independent configuration optical amplifier", Electron. Lett., vol. 24, p. 1075–1076, 1988 by N. A. Olsson. Therein is described how polarisation-independent gain is achieved through making the input signal pass a semiconductor-laser amplifier twice, the signal after the first passage going through a so called Faraday-rotator with a rotation angle of 45°, is reflected and whereupon it again passes the Faraday-rotator whereafter it for the second time goes through the laser amplifier with a polarisation which has been rotated 90°. Even in this case the amplifier itself is polarisation-dependent whereas the polarisation is controlled and rotated respectively by separate units. According to another known embodiment as disclosed by G. Grosskopf, R. Ludwig, R. G. Waarts, H. G. Weber in "Optical amplifier configurations with low polarisation sensitivity", in Electron. Lett., vol. 23, p. 1387–1388, 1987, instead two separate amplifiers are used in combination. Thereby is described how the amplifiers either can be arranged in series or in parallel. In the case of coupling in series an optical wave with TE-polarisation in amplifier 1 has TM-polarisation in amplifier 2 and vice versa, and if both amplifiers exhibit equal gain properties, a polarisation-independent system is achieved. In the case of amplifiers arranged in parallel, the input signal first has to go through a polarisation splitter. Even in those cases the amplifiers are thus polarisation dependent whereas the system seen from the outside is polarisation-independent. It is also known to use amplifiers connected in series with a polarisation insensitive isolator arranged inbetween which rotates the polarisation 90°. This is described in "Polarisation insensitive optical amplifier consisting of two semiconductor laser amplifiers and a polarisation insensitive isolator in series", IEEE Phot. Technol. Lett., vol. 1, p. 431–433, 1989 by M. Koga, T. Matsumoto. It is furthermore known to make active wave guides, the thickness of which being essentially the same as its width, which may get similar properties for TE-and TM-polarised signals respectively. According to a further known embodiment, so called strained multiple quantum wells (MQWs) are used in an active wave guide. (Disclosed in "Polarization insensitive travelling wave type amplifier using strained multiple quantum well structure", IEEE Phot. Technol. Lett., vol. 2, p. 556–558, 1990 by K. Magari et. al.)

However, none of these devices solves in a satisfactory way the above mentioned problems. The first-cited solutions require external components. This gives rise to a complex system which is therefore expensive and under certain circumstances also sensitive to disturbances and leads to difficulties upon integration for example in communication systems. In the case of fabrication of wave-guides where the thickness and the width are comparable it is required that a symmetrical cross-section is achieved in order to get the same gain-characteristics for TE- and TM-modes respectively. Finally the amplifier with Strained MQWs works satisfactory only for one gain level. For polarisation independent filters the wave guides have to get the same effective index for the TE- and TM-modes respectively. According to a known embodiment this has been achieved through use of very small index steps. This however leads to a poor flexibility upon forming of wave guides which in turn may lead to problems for example upon monolithic integration with other components. (See for example "Bragg gratings on InGaAsP/InP wave guides as polarisation independent optical filters", J. Lightwave Technol., vol. 7, p. 1641–1645, 1989 by C. Cremer et al).

SUMMARY OF THE INVENTION

The object of the present invention is to solve the above-mentioned problems through a device which as such is polarisation-independent. A further object of the invention is to provide a method for polarisation independent processing of optical signals. These and other objects are achieved through a device and a method as claimed by the present application.

The invention thus provides a general solution for cancelling of the polarisation dependence of properties in optical wave-guide devices as for example optical semiconductor amplifiers, reflection-filters or the combination of those such as polarisation-independent wave-length selective amplifiers. According to the invention the polarization-rotation takes place in the wave-guide itself. The rotation itself could be achieved in different ways but according to a preferred embodiment of the invention it is achieved through an in the wave-guide arranged polarisation converter being comprised by a periodically asymmetric perturbation. In "Polarization rotation in asymmetric periodic loaded rib waveguides", Appl. Phys. Lett., vol. 59, p. 1278–1280, 1991 by Y. Schani, R. Alferness, T. Koch, U. Koren, M. Oron, B. I. Miller, M. G. Young, is disclosed how polarization-conversion can be achieved in a passive wave-guide. Here the energy of the light is thus transferred from the so called TE-mode to the so called TM-mode and the polarization conversion is achieved through use of a periodically asymmetric wave-guide. In an amplifier according to the invention an incident optical signal is rotated in the amplifier and the signal senses the gain properties of the amplifier for TE-mode as well as for TM-mode during the propagation of the signal through the device. Through giving the wave guide an appropriate length the amplifier will be polarization-independent. This is particularly the case when its length corresponds to a rotation of a multiple of $\pi$ radians. In order to achieve this rotation is particularly a wave-guide-structure required which couples the two modes of polarization. As mentioned above this is achieved particularly through an asymmetrically periodic perturbation in the wave guide in the form of an active and/or a passive material. In accordance with the invention the wave-guide comprises any form of polarisation converter which in its turn can be formed in a convenient way. Through an appropriate choice of length of the wave-guide the polarisation-dependence of the properties will be cancelled by averaging and the function of the device will be insensitive as to the polarisation-state of the incident signal. This also means that the properties of the wave-guide without polarisation rotation for the TE-modes and the TM-modes respectively do not have to be the same. It can be shown that the gain that an optical input signal will experience will be the same as the geometrical average of the transversal electrical and the transversal magnetical signal amplification respectively for a corresponding active wave-guide without any asymmetrical perturbation and independently of the polarisation state of the incident signal. This value of the gain does not comprise the extra losses associated with the perturbation. The bigger the perturbation and the shorter the length of the device, the bigger the added losses per perturbation interface will be. Since only a few perturbation periods are required for a rotation of $\pi$ radians, a very broad passband for the polarisation-rotation is achieved which is comparable to that of long-wave-length-semiconductor-laser-amplifiers e.g. amplifiers for 1.5 $\mu$m wave-length signals. This means that the optical bandwidth of the polarisation converter will not limit the gain-band-width of the amplifier. The periodicity of the asymmetrical perturbation is given by the constants of propagation of the TE-modes and the TM-modes respectively which in their turn are given by geometry and structure of the cross-section of the wave-guide whereas the length of the amplifier can take one of several possible values corresponding to a multiple of $\pi$ rad rotations. Generally it can be said that the polarisation sensitivity gets less the larger the number of rotations taking place in the wave guide but already with one rotation corresponding to $\pi$ rad a very good result is achieved. Then it is however of greater importance that the length is exactly such that it corresponds to the wished rotation. I.e. if the length somewhat differs this gives a bigger error if it corresponds to one $\pi$ rad rotation than to two, three or more in which case the accuracy will no more be so very critical. When the device is in the form of a reflection-filter what is stated above is in general valid apart from the wave guide preferably being passive. A traditional filter has one passband, in this case there are two. It can be shown that an active corrugated wave-guide comprising a phase shift of $\pi$ radians in both corrugation and in the periodically asymmetric perturbation generally is polarisation dependent but shows a polarisation independent reflection and transmission for signals which have a linear polarisation on incidence. Furthermore the wave guide also comprises a corrugation or a periodical variation. The periodicity of the corrugation is given by the constant of propagation and the refractive index for either the TE-mode or the TM-mode. If it is the wavelength in vacuum, then the refractive index has to be specified. The asymmetrical periodicity of the wave-guide is given by the propagation constants for the TE-modes and the TM-modes respectively. Furthermore, as typical monomode-wave-guide-geometries are concerned, the difference in propagation-constants between the polarisation-modes makes TE-polarized and TM-polarized signals respectively to be reflected at different wave-lengths, resulting in the two pass-bands. In order to work satisfactorily the polarization-state of the signal must consequently be controlled. A coupling between the two polarization-modes gives the advantage that the device will get independent of polarization and it can be shown that the reflected optical power will be independent of polarization-state of the optical incident signal if the length of the filter is chosen in the manner described above. This filter configuration can also be monolithically integrated. According to one embodiment the device is semi-conducting.

According to a further embodiment of the invention the device comprises an amplifying reflection-filter. The wave-guide can thereby be seen as composed of two different parts where one part comprises the amplifier and the other part comprises the reflector. In this case an asymmetrically periodic perturbation goes through the whole wave-guide whereas only that part corresponding to the reflector comprises a corrugation, i.e. a grating filter. This is an example of a structure which is well suited for being monolithically integrated. See e.g. "Monolithically integrated 2×2 InGaAsP/InP Laser Amplifier Gate Switch Arrays" by Mats Janson et al presented at the 17th European Conf. on Optical Communication ECOC 91, 9–12 Sep. 1991. The invention furthermore relates to a method for polarization-independent processing of an optical signal in an optical device.

BRIEF DESCRIPTION OF THE DRAWINGS

The invention will in the following be described in a non-limiting way by reference to the appended drawings wherein:

FIG. 1a illustrates a cross-sectional view taken along lines Ia—Ia of FIG. 1, FIG. 1b illustrates a schematical, cross-sectional view taken along lines Ib—Ib of FIG. 1, FIG. 5 illustrates a longitudinal cross-sectional view taken from the side of an amplifying reflection filter.

DETAILED DESCRIPTION

Figure 1:
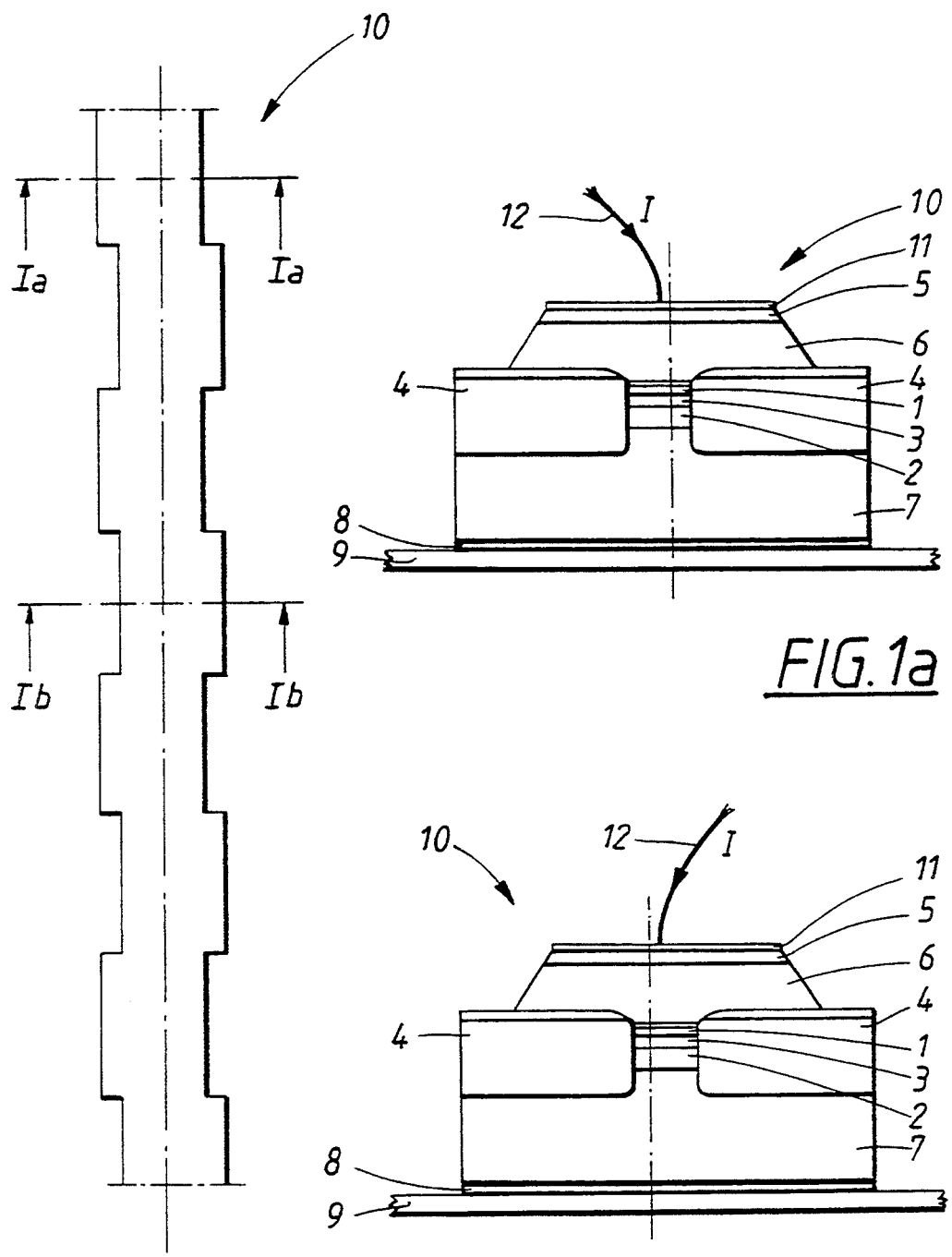
FIG. 1 illustrates a first embodiment of an optical semiconductor-amplifier in a longitudinal, horizontal cross-sectional view.

In an optical semiconductor device in the form of an amplifier an active wave-guide 10 is arranged. According to the examples which are illustrated in FIG. 1 the wave-guide itself is periodically displaced towards the sides in relation to its line of symmetry wherethrough a periodically asymmetric wave-guide is formed. The wave-guide could of course also be straight and instead comprise an active material which is arranged in a periodically asymmetric manner. FIG. 1a illustrates a cross-sectional view through the wave-guide 10 taken along lines Ia—Ia of FIG. 1 whereas FIG. 1b illustrates a cross-sectional view of the wave guide 10 taken along lines Ib—Ib where the asymmetry is reversed in relation to FIG. 1a. The cross-sectional view that is illustrated in FIG. 1b is the same as the cross-sectional view which is illustrated in FIG. 1a with the only difference that the figures illustrate different positions in relation to the longitudinal centre line which goes through the wave-guide 10. In the shown embodiment a current is sent through a connection wire 12 e.g. of gold, to an electrode 11 which is arranged on a ternary layer 5 which comprises three semiconducting materials (GaInAs). This ternary layer 5 is grown on a p-doped contact layer 6 of indium phosphide. The active or amplifying material 1 is arranged under one part of the contact layer 6. In reality the width of the active layer 1 is narrower, but this is for reasons of clarity not indicated in the Figure. After the active layer 1 follows, for manufacturing reasons, an intermediate layer 3 of indium phosphide whereafter a transparent layer 2 follows which is made of galliumindiumarsenidephosphide with a bandgap of 1,3 μm. Thereafter (i.e. below) follows an n-doped surrounding layer 7 which is metallized 8 and, for fabricational reasons, soldered onto e.g. a silicon plate 9 comprising a convenient electrical connection pattern. The current, I, cannot go through the so called semi-insulating layers 4 which essentially laterally surround the active material 1, the intermediate layer 3 and the transparent layer 2, therefore it is forced to go through the area comprising the active or amplifying material 1 which thus gives rise to an optical gain. The active or amplifying layer 1 comprises galliumindiumarsenidephosphide with a bandgap of 1,55 μm and has a refractive index which on one hand exceeds the refractive index for the material in the transparent layer designated 2 (GaInAsP with a bandgap of 1,3 μm), which in turn has a refractive index which exceeds the refractive indices for the materials in as well the semi-insulating layer 4 as in the p- and the n-doped indiumphosphide respectively 6, 7. The semi-insulating layer 4 could also be isolating. In the shown embodiment the semi-insulating layer 4 comprises iron-doped indium-phosphide. Furthermore, the wave-guide 10 in the shown embodiment has a so called buried wave-guide-structure which has proven to be convenient but also other optical wave-guide-structures are possible. An amplifier according to what has been shown could be used for monolithic integration.

Figure 2:
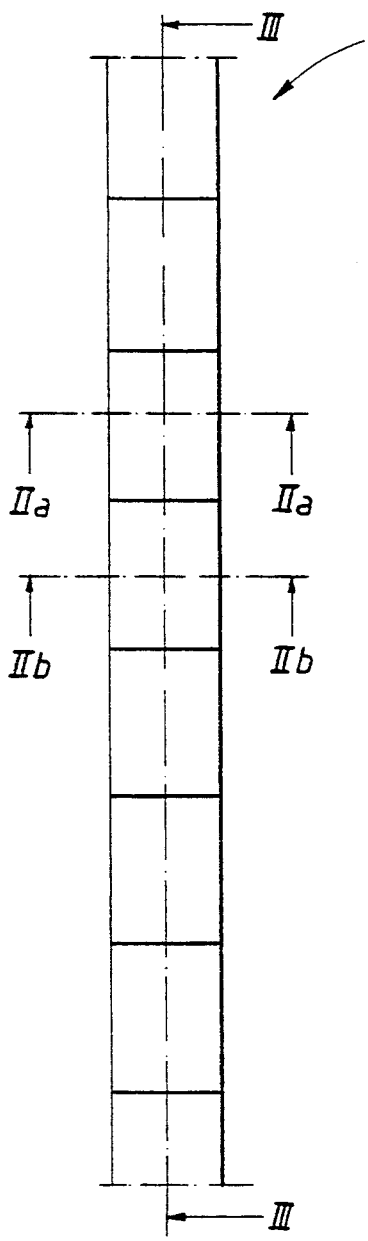
FIG. 2 illustrates an example of an optical filter in a longitudinal, horizontal cross-sectional view.
Figure 2A:
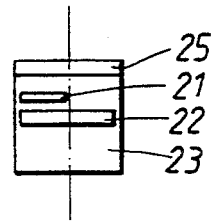
FIG. 2a illustrates a cross-sectional view of the wave-guide taken along lines IIa—IIa of FIG. 2.
Figure 2B:
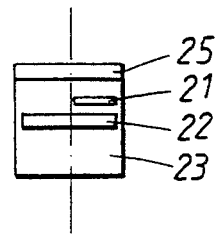
FIG. 2b illustrates a cross-sectional view of the wave-guide taken along lines IIb—IIb of FIG. 2.
Figure 3:
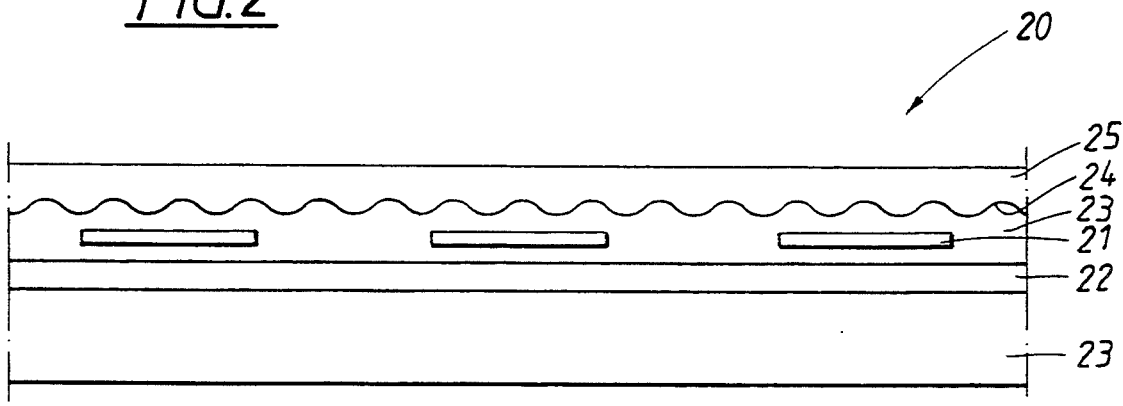
FIG. 3 illustrates a longitudinal cross-sectional view of the same optical filter as in FIG. 2 taken along lines III—III, slightly displaced in a different scale.

In optical communication systems it is of great importance that wave lengths can be filtered. An example of a reflection device or an optical filter is shown in FIGS. 2 and 3. The straight wave-guide 20 comprises a periodically asymmetric perturbation which is best illustrated through FIGS. 2a and 2b which are cross-sectional views taken along lines IIa—IIa and IIb—IIb respectively of FIG. 2. The shown cross-sectional views are for reasons of clarity very schematic. A periodically asymmetric perturbation in the form of a first transparent layer 21 is arranged above a second transparent layer 22. The underlying layer 22 is symmetrical in relation to the longitudinal direction of propagation of the wave-guide 20 whereas the layer, or the periodically asymmetric perturbation 21, as shown in FIGS. 2a and 2b respectively takes an alternating position in relation to the longitudinal centre-line of the wave guide 20 where the alternation comprises reflection in said line. Between those two layers 21; 22 can of course at least one surrounding material or layer 23 be arranged which like layers 21, 22 is transparent and which preferably has a lower refraction index than the other underlying layer 22 and the perturbation layer 21 respectively. The surrounding layer 23 may comprise the same material as well above as below the perturbation layer 21 and the second transparent layer 22 or be comprised by two or more different surrounding layers. In order to get a reflection-filter, the wave guide 20 must however comprise a second, symmetrical perturbation or corrugation 24 at the interface between the layer (the surrounding material) 23 and the layer 25 which has a dielectric constant which differs from the dielectric constant of the layer 23. According to a particular embodiment the layer 25 may be comprised by air. The wave guide 20 is in this case passive, i.e. the perturbation 21 comprises a transparent material (medium) instead of an active material which would be the case for an amplifier. The filter reflects an incident signal independently of its polarisation state at nominal wave-length, i.e. in the center of the reflection peak but it shows variations within the reflection-characteristica which means that the band-width of the filter varies with the polarisation state. If however the light-source has a well defined wave-length, the variation in polarisation within the reflection characteristica will only to a very small degree have any influence on the concerned system. This is in any case often necessary as wave-length-multiplexed systems are concerned. The input signal comprises light incident along the wave-guide 20 which will not be further described here since it should be obvious. The length is thereby chosen to be such as to correspond to a polarisation-rotation of $\pi$ radians or a multiple thereof. The asymmetrical periodicity of the perturbation layer 21 is given by the propagation-constants of the TE- and the TM-modes respectively whereas the periodicity of the corrugation 24 is given by the propagation-constant for either the TE-mode or the TM-mode. More generally, for an optical amplifier as well as for an optical filter, the degree of asymmetry of the wave-guide together with the field-configuration of a corresponding non-perturbed wave-guide gives the degree of coupling or the transfer of energy between the modes. The higher the degree of asymmetry the stronger the coupling which results in a faster polarisation-rotation which means that the amplifier or the filter can be shorter. Since the light periodically is converted between the TE- and the TM-mode respectively, an amplifier as well as a filter may have, as mentioned above, a number of lengths. The optimal length of filter is to some extent governed by the reflection-strength of the grating or the corrugation 24 and the optimal length of the amplifier is also to some extent influenced by the gain-level in question. Thus the reflection filter illustrated in FIGS. 2 and 3 does also have a buried waveguide-structure although also other optical wave-guide-structures are possible, e.g. a ridge structure. The device may also operate as a transmission filter and the invention is not limited to a reflection filter. According to a different embodiment of the invention the perturbation layer 21 can be active. According to a further embodiment the layer 22 may be active. Furthermore, alternatively an active layer (not shown) may be arranged between layers 21 and 22, said layer being arranged on top of layer 22. By choosing the length of the optical filter (which in this case corresponds to the length of the wave-guide 20) the power of the reflected optical signal will be independent of the polarisation-state of the input signal. It should however be noted that, as mentioned in the foregoing, that an active corrugated wave-guide comprising a phase shift of $\pi$ radians in both corrugation and in the periodically asymmetric perturbation generally is polarisation dependent but shows a polarisation independent reflection and transmission for signals which have a linear polarisation on incidence.

Figure 4:
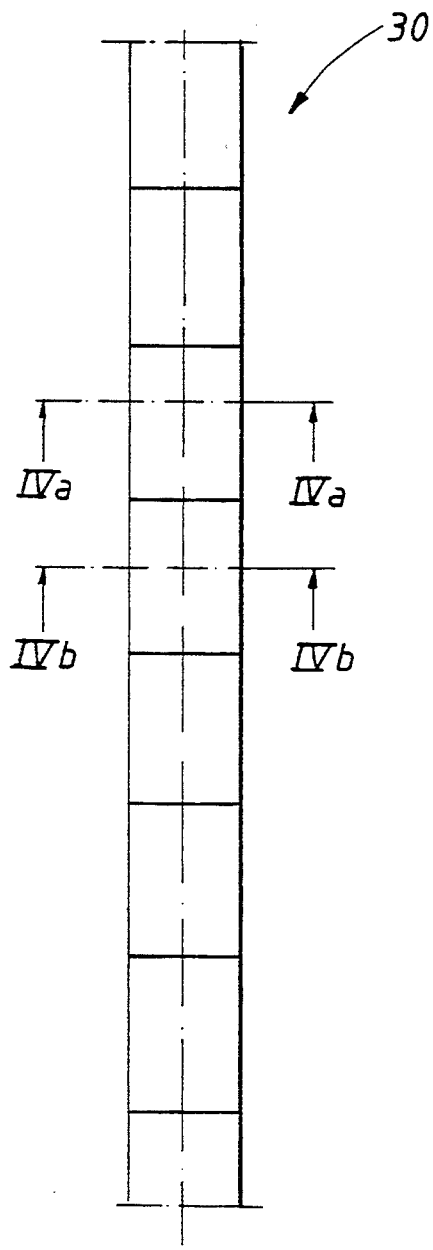
FIG. 4 illustrates an alternate embodiment of an optical amplifier with a preferably straight wave-guide analogue to FIG. 1.
Figure 4A:
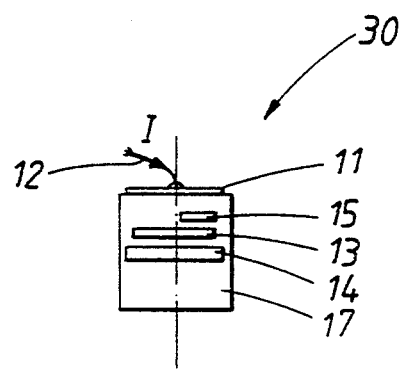
FIG. 4a illustrates a transversal cross-sectional view of the amplifier according to FIG. 4 taken along lines IVa—IVa.
Figure 4B:
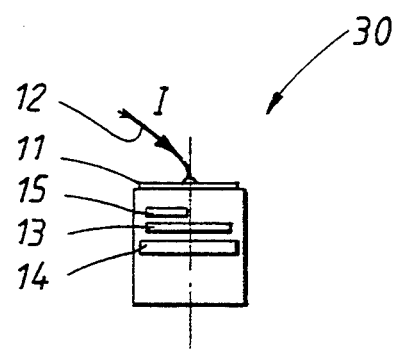
FIG. 4b illustrates a transversal cross-sectional view of the amplifier taken along lines IVb—IVb of FIG. 4.

In FIGS. 4a and 4b respectively a particularly advantageous embodiment of an optical amplification device according to the invention is shown. In this case two transverse cross-sectional views of the wave guide 30 are shown merely schematically, the cross-sectional views being taken in each asymmetrical position of the perturbation in relation to the longitudinal centre-line of the wave guide 30. Similar to the first embodiment a current is injected through a gold connection-wire 12 or similar to a metal-electrode 11 which can be arranged on a ternary layer which is not shown in this embodiment. The illustrated wave-guide 30 is straight and comprises a periodically asymmetric perturbation 15 in the form of a transparent layer the position of which in relation to the longitudinal centre axis of the wave-guide 30 is illustrated through FIGS. 4a and 4b respectively. With a surrounding material 17 (in reality there is considerably more surrounding material 17, i.e. the device is wider or the width of the device in relation to the width of the layers 13, 14, 15 is bigger than shown in the figure) the refractive index of which is lower than the refractive index for the transparent material of the perturbation 15, follows below the perturbation 15 an, in relation to the longitudinal centre line of the wave guide 30, symmetrically arranged amplifying layer or an active layer 13. The active layer 13 may also be periodically asymmetrically arranged (not shown). Under the active layer 13 follows, in the shown embodiment with a surrounding material 17 having the lowest refractive index, an underlying transparent layer 14 which also is symmetrically arranged in the relation to the longitudinal centre line of the wave guide 30. Similar to the embodiment shown in FIGS. 1, 1a, 1b the lower part of the surrounding material 17, which particularly as doping is concerned, may differ from the corresponding surrounding material with the same reference numeral and of a different location in the structure, and may be metallized and for example soldered onto a silicon-plate or similar. Moreover, the materials of the layers 13, 14, 15, 17 where the surrounding material 17 may comprise one or more layers, can be chosen in an accurate manner or analogue to the embodiments corresponding to FIGS. 1, 1a, 1b. Since the semi-conducting material of the optical amplifier is pumped with an electrical current, the injection-current I, the optical gain may be controlled via the current supply (this is of course also the case for the amplifier according to embodiment of FIG. 1 as for other embodiments). In this embodiment the perturbation thus comprises a passive substance whereas the perturbation according to FIG. 1 comprises passive as well as active materials. It could also be purely active.

According to a further embodiment shown in FIG. 5, the wave guide 40 comprises a first active part 41 and a second passive part 42 in order to form an amplifying optical filter. Light is incident from the left in the figure and goes from one end to the other and back again in reflection. This embodiment is only shown very schematically since it builds on the principles discussed above with the difference that the wave-guide 40 should be so made that it takes the same form all along. This is however not required other possibilities are possible. In the shown embodiment the wave-guide 40 comprises a so called straight wave-guide. A transparent material 44 is for example so arranged in the wave-guide 40 that it extends essentially parallel to the longitudinal centre-line of the wave guide 40 and in a similar way in the active part 41 as in the passive part 42. A periodically asymmetric perturbation 43 is arranged in a similar way as well in the active part 41 as in the passive part 42 of the wave-guide 40. The perturbation 43 preferably comprises a transparent material. A second transparent layer 44 is, analogue to FIGS. 4a, 4b, arranged under the periodically asymmetric perturbation 43. The active part 41 of the wave guide 40 may thereby comprise a separate layer 45 of an active material which is symmetrically arranged in relation to the longitudinal centre-line or alternatively this part of the wave guide 41 can also in a different manner comprise an active material. The corrugation 24 in the passive part 42 of the wave guide 40 is for example arranged similar to the in embodiment shown in FIG. 3 and it forms an interface between two layers or media 23, 25 having different dielectric-constants. In the case of an amplifying filter a polarisation rotation corresponding to essentially $\pi$ radians should take place in as well the active part 41 as in the passive part 42. Surrounding materials, current supply and so on may be formed and supplied according to what has been disclosed above or in similar ways. Furthermore, the wave-guide may also comprise several perturbations. It should also be added that the periodicity gets i genoral different in the first part 41 and in the second part 42. This combination of a laser-amplifier and a wave-length-filter is particularly intended for wave-lengths-multiplexed-optical-communication-systems where the information is transmitted via several different wave-lengths in the same wave guide.

The invention furthermore relates to a method for polarisation-independent processing of a signal. The processing may particularly comprise amplification or wave-length-selective reflection or a combination thereof.

Figure 6:
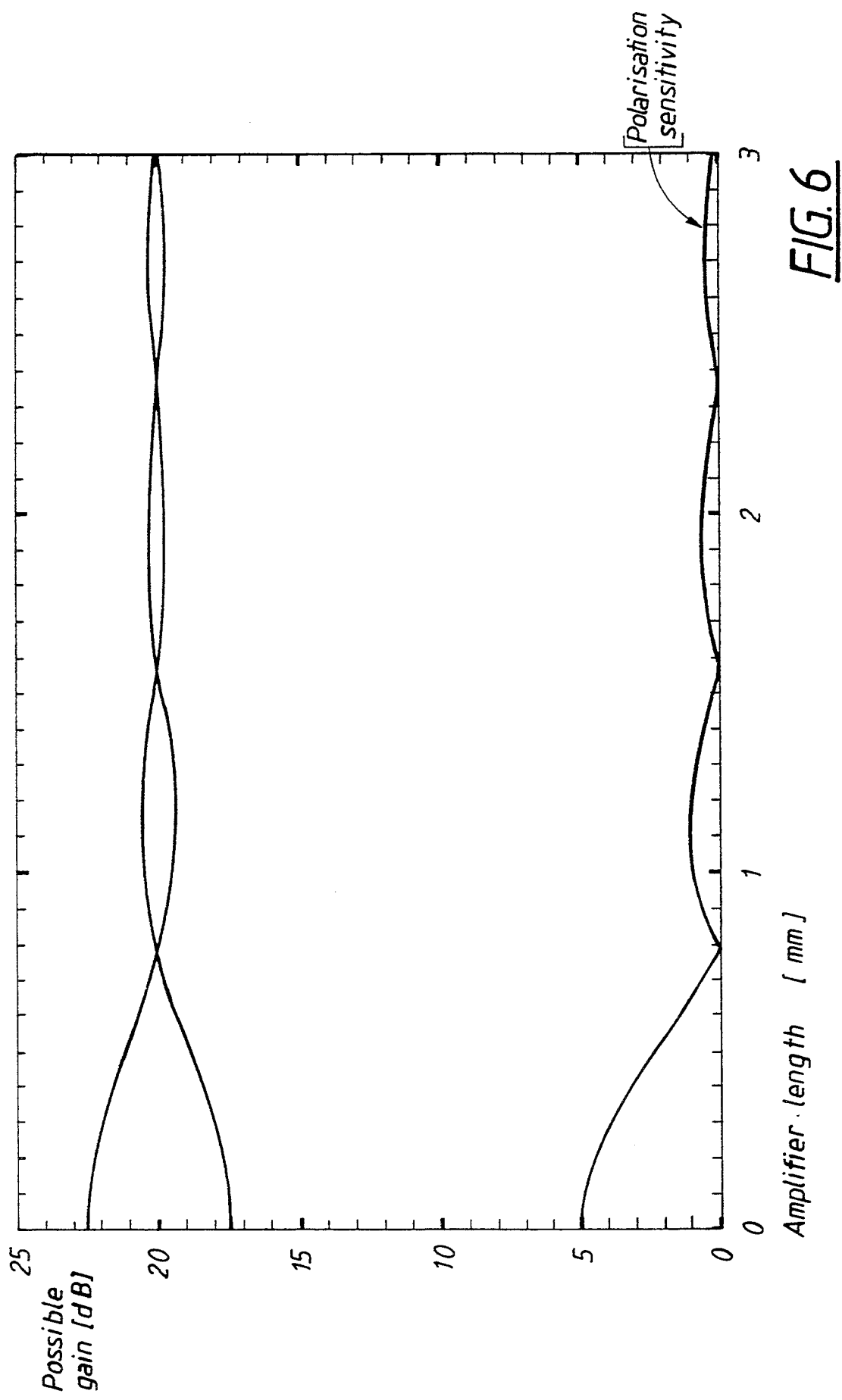
FIG. 6 illustrates the dependence of the gain and the polarization-sensitivity on the length of the wave-guide.

FIG. 6 shows a diagram of how the gain in decibel varies with the length of the amplifier in millimeters for signals with an arbitrary polarisation state upon incidence out of which also the illustrated polarisation sensitivity is obtained. (The polarisation-independent gain is fixed). (The two curves give a so called envelope for different polarisations). As can be seen, the polarisation sensitivity is a function of the amplifier-length and takes with a certain periodicity the value 0. Those values correspond to equal gain independent of the polarisation-state of the incident signal. It can also be seen that the variation in amplification for different polarisation-states asymptotically approaches one value the longer the amplifier. For practical reasons it is however mostly desirable to keep the length of the amplifier as short as possible. It can also be seen from the figure that a small variation in length of the amplifier, or the wave guide, gives a certain difference in amplification of differently polarized input signals at the first minimum in polarisation-sensitivity. At the second minimum a slight deviation from its minimum has a considerably smaller impact on the difference in amplification between the respective modes. Thus a tradeoff can be done in relation to what is most important, to somewhat increase the length of the wave-guide, but with a lower fault-sensitivity for lengths or to keep a minimal length corresponding to the first minimum in polarisation sensitivity, i.e. a rotation corresponding to $\pi$ radians but where the length of the wave-guide is more critical. According to a preferred embodiment the optical amplifier, and the optical reflection-filter respectively, are so formed that they are convenient for so called monolithic integration. This is amongst others of importance since it is desirable to be able to u monolithically integrated components in a system comprising conventional monomode-fibres, which do not conserve the polarisation state of the signal.

Figure 7:
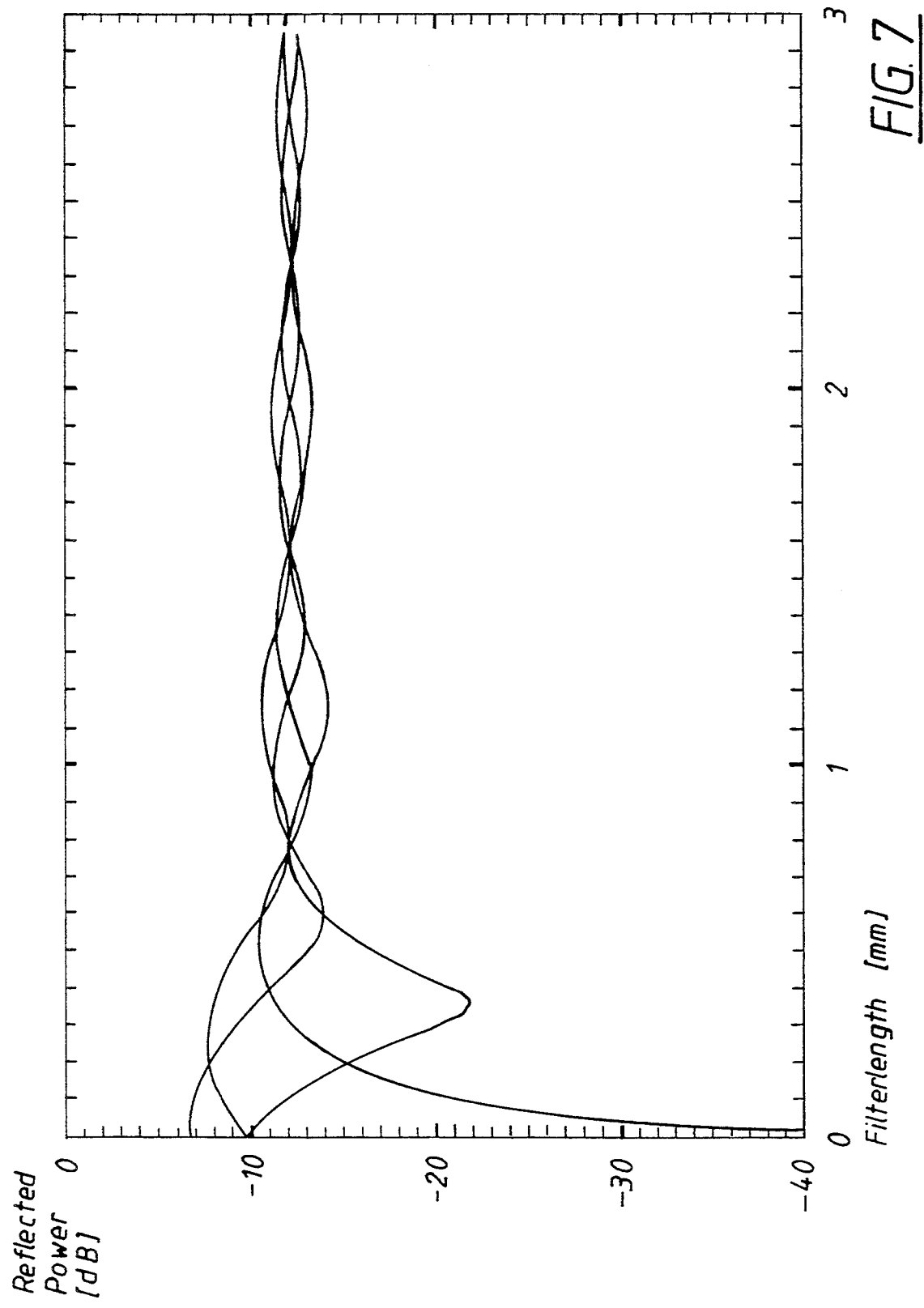
FIG. 7 illustrates reflected signal-power for signals with four different polarization-states upon incidence as a function of the length of the filter.

In FIG. 7, similar to FIG. 6, the reflection in decibel is shown for different states of input polarisation, as a function of the length in millimeters of the filter. The figure is an illustration of possible values of reflected signal power in decibel for signals with four different states of polarisation upon incidence. The coupling-strength of the filter is thereby fixed. The degree of reflection which is obtained in this case is about $-12$ dB. With a different coupling strength the reflection can be increased.

In conclusion it can be said that an optical device according to the invention may be formed in a lot of different ways and it can be so formed that it could be used as an optical amplifier, a reflection filter or a combination of both. Polarization rotation is achieved in the wave-guide and its length is chosen in an appropriate way. The wave-guide may for example take a large number of different forms (some of which are given herein), have different structures as well as different materials, and the term material is here understood to include different media as for example air and so on. Moreover, the invention shall of course not be limited to the shown embodiments but can be freely varied within the scope of the appended claims.

What is claimed is:

1. Optical device comprising a wave-guide and a polarisation converter, wherein the wave-guide and the polarization converter comprise an integral unit and the length of the wave-guide is so chosen in relation to the rotation of the polarisation-state of an input signal that the device is substantially polarisation independent.

2. Optical device according to claim 1, wherein the length of the wave-guide is such that the wave-guide produces a polarisation-rotation of a multiple of substantially $\pi$ radians.

3. Optical device according to claim 1 wherein the polarisation converter comprises a periodically asymmetric perturbation in the wave-guide.

4. Optical device according to claim 1 wherein the polarisation converter comprises a periodically asymmetric wave-guide.

5. Optical device according to claim 3, wherein the periodically asymmetric perturbation is produced in the wave-guide by at least one perturbing material having a first dielectric-constant $\epsilon_1$, which is surrounded by at least one surrounding medium having at least one dielectric-constant $\epsilon_2$ different from $\epsilon_1$, the perturbing material being periodically, asymmetrically arranged in relation to the longitudinal centre-line of the wave-guide and at least the perturbing material and a surrounding medium have different dielectric constants.

6. Optical device according to claim 4, wherein the periodically asymmetric wave-guide comprises at least one perturbing material having a first dielectric-constant $\epsilon_1$, which is surrounded by at least one surrounding medium having at least one dielectric-constant $\epsilon_2$ different from the $\epsilon_1$, the at least one perturbing material and at least one surrounding medium being periodically, asymmetrically arranged in relation to the longitudinal centre-line of the wave-guide and the at least one perturbing material and a surrounding medium having different dielectric constants.

7. Optical device according to claim 5 wherein at least a portion of the at least one perturbing material is active.

8. Optical device according to claim 6, wherein at least a portion of the at least one perturbing material comprises a passive material.

9. Optical device according to claim 7, wherein the wave-guide has a buried structure.

10. Optical device according to claim 8, wherein the wave-guide has a buried structure.

11. Optical device according to claim 7, wherein the active portion of the at least one perturbing material is a semi-conducting material which is pumped with an electrical injection-current.

12. Optical device comprising a wave-guide and a polarisation converter, wherein the wave-guide and the polarisation converter comprise an integral unit and the length of the wave-guide is such in relation to the rotation of the polarisation-state of an input signal that the device is substantially polarisation independent, the wave-guide being active and the device being a laser-amplifier.

13. Optical device according to claim 12, wherein the length of the wave-guide is such that it corresponds to a polarisation rotation of a multiple of substantially $\pi$ radians.

14. Optical device according to claim 12, wherein the polarisation converter comprises a periodically asymmetric perturbation in the wave-guide.

15. Optical device according to claim 13, wherein the polarisation converter comprises a periodically asymmetric perturbation in the wave guide.

16. Optical device according to claim 14, wherein the periodically asymmetric perturbation is achieved through at least one perturbing material having a first dielectric-constant $\epsilon_1$, which is surrounded by at least one surrounding medium having at least one dielectric-constant $\epsilon_2$ different from $\epsilon_1$, at least the perturbing material being periodically, asymmetrically arranged in relation to the longitudinal centre-line of the wave-guide and at least the perturbing material and a surrounding material having different dielectric constants.

17. Optical device according to claim 15, wherein the periodically asymmetric perturbation is achieved through at least one perturbing material having a first dielectric-constant $\epsilon_1$, which is surrounded by at least one surrounding medium having at least one dielectric-constant $\epsilon_2$ different from $\epsilon_1$, at least the perturbing material being periodically, asymmetrically arranged in relation to the longitudinal centre-line of the wave-guide and at least the perturbing material and a surrounding material having different dielectric constants.

18. Optical device according to claim 16, wherein at least a portion of the at least one perturbing material is active.

19. Optical device according to claim 17, wherein at least a portion of the at least one perturbing material comprises a passive material.

20. Optical filter comprising a passive wave-guide and a polarisation converter, wherein the wave-guide and the polarisation converter comprise an integral unit and the length of the wave-guide is such in relation to the filter's rotation of the polarisation-state of an input signal that the filter is substantially polarisation independent, the wave-guide further comprising a corrugation filter.

21. Optical filter according to claim 20, wherein the length of the wave-guide is such that it corresponds to a polarisation rotation of a multiple of substantially $\pi$ radians.

22. Optical filter according to claim 20, wherein the polarisation converter comprises a periodically asymmetric perturbation in the wave-guide.

23. Optical filter according to claim 22 wherein the periodically asymmetric perturbation is achieved through at least one perturbing material having a first dielectric constant $\epsilon_1$, which is surrounded by at least one surrounding medium having at least one dielectric constant $\epsilon_2$ different from $\epsilon_1$, the perturbing material being periodically, asymmetrically arranged in relation to the longitudinal centre-line of the wave-guide and at least the perturbing material and a surrounding material having different dielectric constants.

24. Optical filter according to claim 20, wherein the wave-guide and polarisation converter are passive.

25. Optical filter according to claim 20, wherein the periodicity of the corrugation is based on propagation constants of the input signal's TE- or TM-mode.

26. Amplifying filter comprising a wave-guide and a polarisation converter, wherein the wave-guide and the polarisation converter comprise an integral unit and the length of the wave-guide is such in relation to the filter's rotation of the polarisation-state of an input signal that the filter is substantially polarisation independent, the wave-guide comprising a first active part and a second passive part, the passive part comprising a corrugation.

27. Method for polarisation-independent processing of an optical signal, the signal going through a wave-guide, wherein the signal is polarisation-rotated during its passage through the wave-guide, comprising the step of providing the length of the wave-guide such that the polarisation rotation of the signal is substantially independent of the signal's polarisation-state upon incidence on the wave-guide.

28. Method according to claim 27, wherein the length of the wave-guide is such that a polarisation-rotation of substantially a multiple of $\pi$ radians is carded out in the wave-guide.

29. Method according to claim 27, further comprising the step of providing a wave-guide having a periodically asymmetric perturbation comprising a passive and/or an active material for polarisation-rotation, the speed of rotation in the wave-guide being determined by a degree of asymmetry in dielectric-constant, at least the asymmetrical perturbation comprising a material having a predetermined dielectric-constant surrounded by at least one different material having a different dielectric constant.

30. Method according to claim 28, wherein the wave-guide comprises a periodically asymmetric perturbation comprising a passive and/or an active material for polarisation-rotation, the speed of rotation in the wave-guide being determined by a degree of asymmetry in dielectric-constant, at least the asymmetrical perturbation comprising a material with a certain dielectric-constant being surrounded by at least one different material with a different dielectric-constant.

31. Method according to claim 29, wherein the wave-guide comprises an active material and the perturbation is achieved through an active and/or a passive material, whereby the optical signal is amplified.

32. Method for filtering by optical reflection an incident optical signal, comprising the step of providing the incident optical signal to a wave-guide, wherein the optical signal is polarisation-rotated during its passage through the wave-guide, the wave-guide comprising a periodically asymmetric perturbation for achieving the rotation and a corrugation for wave-length selection, the length of the wave-guide being such that it rotates the polarisation-state of the optical signal by substantially a multiple or $\pi$ radians.

33. Method according to claim 30, wherein the polarisation of the signal is rotated during its passage through a wave-guide which comprises a first part and a second part, one part being active and the second being passive and furthermore comprising a corrugation, a perturbation causing the rotation and said perturbation going through the first part as well as the second part of the wave-guide, whereby the optical signal is filtered and amplified.

34. Method according to claim 31, wherein the polarisation of the signal is rotated during its passage through the wave-guide which comprises a first part and a second part, one part being active and the second being passive and furthermore comprising a corrugation, a perturbation causing the rotation and said perturbation going through the first part as well as the second part of the wave-guide, whereby the optical signal is filtered.

35. Method according to claim 32, wherein the polarisation of the signal is rotated during its passage through the wave-guide which comprises a first part and a second part, one part being active and the second being passive and furthermore comprising a corrugation, a perturbation causing the rotation and said perturbation going through the first part as well as the second part of the wave-guide, whereby the optical signal is amplified.

* * * * *